(12) United States Patent
Gu et al.

(10) Patent No.: US 8,679,287 B2
(45) Date of Patent: Mar. 25, 2014

(54) METHOD AND APPARATUS FOR PREVENTING ALD REACTANTS FROM DAMAGING VACUUM PUMPS

(75) Inventors: Youfan Gu, Superior, CO (US); David Neumeister, Loveland, CO (US)

(73) Assignee: MKS Instruments, Inc., Andover, MA (US)

( * ) Notice: Subject to any disclaimer, the term of this patent is extended or adjusted under 35 U.S.C. 154(b) by 860 days.

(21) Appl. No.: 11/136,610

(22) Filed: May 23, 2005

(65) Prior Publication Data

US 2006/0264045 A1 Nov. 23, 2006

(51) Int. Cl.
*H01L 21/443* (2006.01)

(52) U.S. Cl.
USPC ...................... 156/345.29; 118/715

(58) Field of Classification Search
USPC ...................... 156/345.29; 118/715
See application file for complete search history.

(56) References Cited

U.S. PATENT DOCUMENTS

| | | | |
|---|---|---|---|
| 5,819,683 A * | 10/1998 | Ikeda et al. | 118/724 |
| 6,383,300 B1 | 5/2002 | Saito et al. | |
| 6,506,352 B1 * | 1/2003 | Lindfors et al. | 423/240 S |
| 2005/0148199 A1 * | 7/2005 | Jansen | 438/761 |

FOREIGN PATENT DOCUMENTS

| | | | |
|---|---|---|---|
| EP | 0384803 | | 8/1990 |
| JP | 60001827 A | * | 1/1985 |
| WO | WO9932686 | | 7/1999 |

* cited by examiner

*Primary Examiner* — Jeffrie R Lund
*Assistant Examiner* — Satish Chandra
(74) *Attorney, Agent, or Firm* — James R. Young; Cochran Freund & Young LLC

(57) ABSTRACT

A secondary reaction chamber with a mesh reactor element and a heater assembly are positioned in a foreline between a CVD reaction chamber and a vacuum pump to mix and react all previously unreacted precursor reactants to remove them from the effluent before they can reach and damage the vacuum pump.

8 Claims, 6 Drawing Sheets

METHOD AND APPARATUS FOR PREVENTING ALD REACTANTS FROM DAMAGING VACUUM PUMPS

BACKGROUND OF THE INVENTION

1. Field of the Invention

The present invention is related to traps for removing reactants from reaction chamber effluents, and more specifically to a method and apparatus for removing reactants in effluents of atomic layer deposition and other processes before they can damage vacuum pumps.

2. State of the Prior Art

Atomic layer deposition (ALD) of thin-film materials in semiconductor device fabrication, such as thin barrier layers, high dielectric constant (high K) layers for capacitors and gate dielectric layers, and the like, has a number of advantages. For example, ALD processes typically have low particle content and relatively low processing temperatures, and ALD produces high quality films with uniform film thicknesses and has the ability to deposit such materials in deep trenches in the substrate materials. However, a number of practical problems in its implementation have inhibited the application of ALD in full scale commercial production of semi-conductor devices and other thin film applications. Recent technological developments aimed at solving these problems, for example, valves capable of more precise control of feed gases to enable increases in rates of deposition are contributing to development of larger scale ALD processes and equipment. However, such larger scale ALD uses have revealed or lead to additional problems that have to be solved in order for ALD to become economically viable for fabrication of thin-film semiconductor materials on a large scale basis.

One of those problems is that because of the inherent nature of ALD with its deposition of one distinct atomic layer at a time with successive flows of reactants separated by short pulses of purge gas. During typical ALD processes, two chemical precursors (A and B) are required to react with each other to form, i.e., deposit, the solid thin film on the wafer (substrate) surface. This process actually involves at least four steps to complete a deposition cycle. First a reactant or precursor A is fed into the ALD process chamber to allow the formation of a monolayer of A molecules on the surface of the substrate by physical adsorption. Then, purge gas (typically inert) is fed into the process chamber to remove the precursor A molecules in gas phase, which eliminates a major source of particles on the wafer (substrate) surface, because gas phase chemical reaction is often the major source of particles on the wafer surface. Next, the precursor B is fed into the process chamber to start the deposition reaction process. Since there are very little, if any, reactive A molecules in the gas phase, chemical reactions occur primarily on the surface of the wafer because of the limited supply of the precursor A. Finally, additional purge is performed before the next deposition cycle starts. It is very clear that large amounts of the reactant gases—often greater than 80 to 90 percent—flow out of the reaction chamber in the effluent. Such large amounts of residual reactant gases in the ALD process effluents cause severe wear and damage to the vacuum pumps, where relatively high temperatures produced in the pump cause them to react together to form highly abrasive particles. In some ALD systems, for example, those used for depositing aluminum oxide ($Al_2O_3$) from trimethylaluminum $Al(CH_3)_3$ and an oxidant or those used to deposit hafnium oxide ($HfO_2$) from hafnium chloride ($HfCl_4$) and an oxidant, the vacuum pumps can become so damaged within a few hours to a few days of operation that they have to be replaced.

Therefore, there is a very significant need for new methods and apparatus for protecting vacuum pumps in ALD systems that are especially suited to the unique characteristics of such ALD reactants and processes.

SUMMARY OF THE INVENTION

Accordingly, a general object of this invention is to protect vacuum pumps in ALD process systems.

A more specific object of this invention is to prevent unreacted ALD precursor reactants in ALD-CVD as well as in some conventional CVD process chamber effluents from reaching the vacuum pumps.

Additional objects, advantages, and novel features of the invention are described in the specification below or are set forth in the claims, or will become apparent to persons skilled in the art upon examination of the specification and drawings or by practicing or using the invention.

To achieve the foregoing and other objects, this invention includes, inter alia—a method of protecting a vacuum pump in a CVD system, including, but not limited to, a ALD-CVD system, from reactants in the effluent of the CVD system. The method comprises, inter alia, heating a reaction element that comprises a mesh in an evacuated secondary reaction chamber positioned in a foreline between the primary or main CVD reaction chamber and the vacuum pump to a temperature that accommodates reaction of the CVD reactants, and flowing the effluent through the mesh in the heated reaction element to react the CVD reactants on the mesh and thereby to consume the reactants. Other novel features and details of the method are described below.

The invention also includes hot reactor trap apparatus for reacting and removing the CVD precursor reactant gases from the effluent before they reach the vacuum pump. Such apparatus can comprise a secondary reaction chamber, a reactor element, and a heating element. The secondary reaction chamber has an inlet and an outlet, and it is made to be positioned in the foreline between the main CVD reaction chamber and the vacuum pump so that the effluent flows through the secondary reaction chamber before reaching the vacuum pump. The reactor element includes a mesh with a plurality of microsurfaces positioned in the secondary reaction chamber between the inlet and the outlet so that the effluent flow has to flow through the mesh. The heater element is also positioned in the secondary reaction chamber to heat the secondary reaction chamber and the reactor element to the desired reaction temperature. A plurality of baffles in the secondary reaction chamber define a tortuous flow path for the effluent to elongate dwell time of the effluent in the secondary reaction chamber and mesh to ensure thorough mixing of the reactant gases and sufficient contact of the reactant gases with the hot mesh microsurfaces to react the reactants and thereby remove them from the effluent. Other novel features and details of the apparatus of this invention are described below.

BRIEF DESCRIPTION OF THE DRAWINGS

The accompanying drawings, which are incorporated in and form a part of the specification, illustrate preferred, but not the only embodiments of the present invention, and together with the written description serve to explain the principles of the invention. In the drawings.

DETAILED DESCRIPTION OF THE PREFERRED EMBODIMENTS

Figure 1:
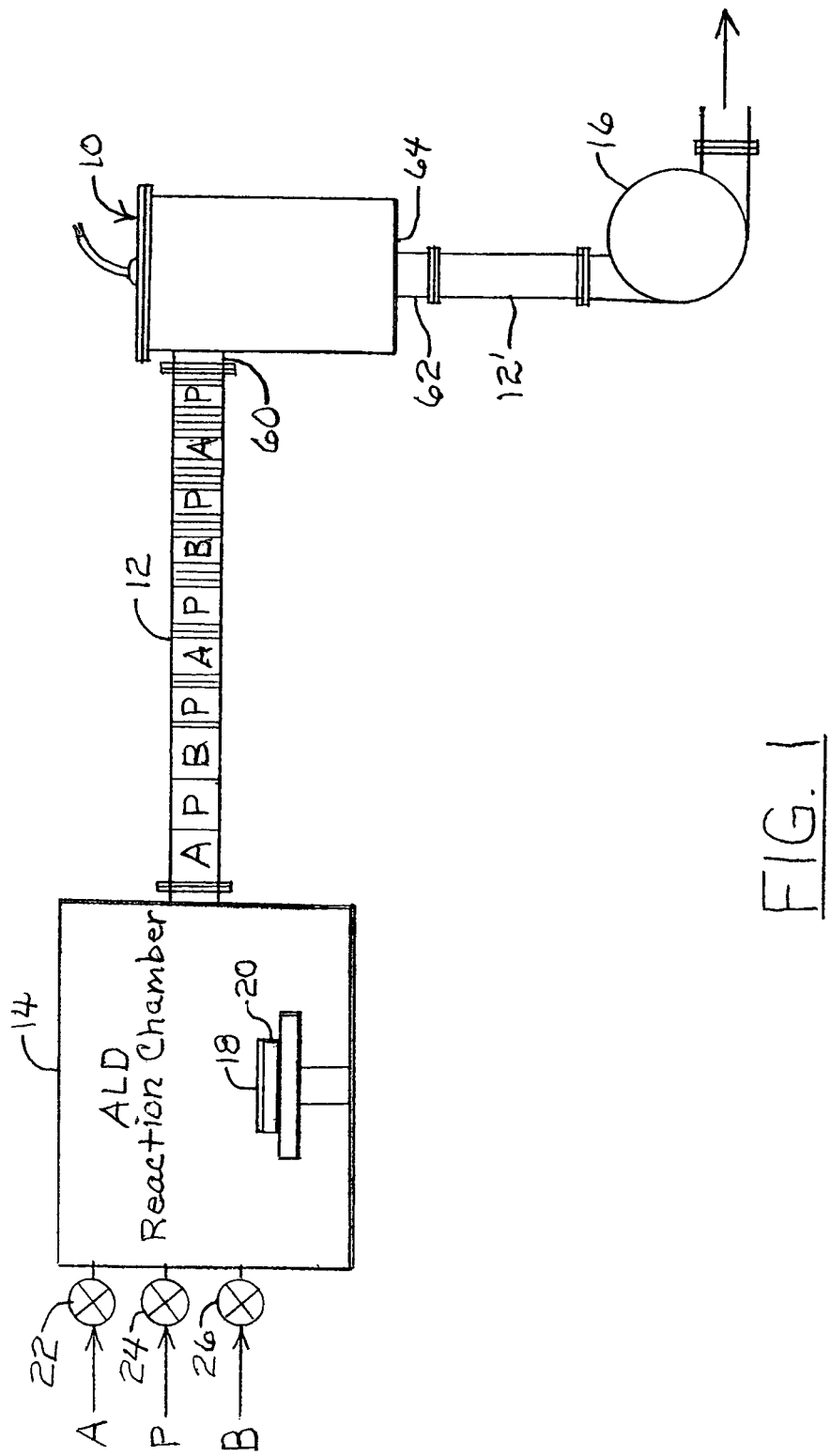
FIG. 1 is a schematic diagram of an ALD system equipped with an example ALD effluent hot reactor trap according to this invention.

An example hot reactor trap 10 is shown schematically in FIG. 1 mounted in the foreline 12 of an atomic layer deposition (ALD) system to prevent ALD reactants A and B in the effluent from the ALD process reaction chamber 14 from reaching and damaging the vacuum pump 16 according to this invention. In a typical ALD chemical vapor deposition (CVD) process system used to deposit a thin film layer 18 of, for example, a high K dielectric $Al_2O_3$, $HfO_2$, or other material on a substrate 20, the reaction chamber 14 is evacuated with a vacuum pump 16 connected to the reaction chamber 14 by a foreline (sometimes also called a pump line) 12, and the reaction chamber 14 and/or substrate 20 is heated to attain a desired substrate 20 surface temperature that enhances the desired reactions of the precursor reactants A and B on the surface of the substrate 20 to build the desired thin-film layer 18 on the substrate 20. Then, sequential flows of the individual precursor reactants A and B, respectively, separated by pulses of an inert purge gas P are flowed through the ALD reaction chamber 14. ALD valves 22, 24, 26 are used to start and stop the successive flows of reactant A, purge gas P, and reactant B, respectively, to produce the sequential flows of those gases, as is well-known to persons skilled in the art.

For example, a first precursor reactant A of triethylaluminum $Al(CH_3)_3$ and a second precursor reactant B of an oxidant, such as oxygen ($O_2$), ozone ($O_3$), or water vapor ($H_2O$), can be used to deposit a thin film layer 18 of aluminum oxide ($Al_2O_3$) on a substrate 20. In such a process, the reaction chamber 14 is evacuated to a base pressure below $10^{-3}$ torr, and it is heated to about 300 to 400° C. Then, the first flow of $Al(CH_3)_3$ results in $Al(CH_3)_3$ either being adsorbed onto the surface of the substrate 18 or reacting with available oxygen or hydroxyl (OH) sites on the surface of the substrate 20. Then, the $Al(CH_3)_3$ is purged from the reaction chamber 14 with an inert purge gas P, such as nitrogen or helium, which is followed by a flow of the oxidant, e.g., $O_2$, $O_3$, or $H_2O$, which reacts with the $Al(CH_3)_3$ to produce an atomic layer of $Al_2O_3$ on the substrate 20 and a by-product of, for example, methane ($CH_4$), which is a gas that flows as part of the effluent out of the reaction chamber 14. The oxidant B is then purged from the reaction chamber 14 by another flow of the purge gas P. Repeated successive cycles of the sequential flows of the first reactant A, e.g., $Al(CH_3)_3$, purge gas P, second reactant B, e.g., $O_2$, $O_3$, or $H_2O$, and purge gas P results in building up the thin-film layer 18 of $Al_2O_3$ one atomic layer at a time.

In typical ALD-CVD processes, only a small portion of the reactants A and B are actually consumed in the surface reactions on the substrate 20 to build up the thin-film layer 18 on the substrate 20, so large proportions, typically greater than 80 to 90 percent of the reactants A and B flow with the effluent out of the reaction chamber into the foreline 12 without undergoing any chemical reaction. Because the sequential flows of reactants A and B are distinct and separated by pulses of purge gas P, their respective flows in the effluent through the foreline 12 are also distinct and separated from each other, as indicated schematically in FIG. 1. If the reactants A and B could be kept separated from each other in the foreline 12 and all the way through the vacuum pump 16, they would not harm the vacuum pump 16. However, as they progress through the foreline 12, the gases mix, and the distinct pulses of A-P-B-P-A-P-B, etc., blur and then disappear due to interdiffusion of the gases in the foreline, so that the reactants A and B do mix together. Therefore, in the high temperatures of the vacuum pump 16, they react to produce hard, highly abrasive particles, which cause extreme wear and damage to the vacuum pump 16. For example, in the $Al_2O_3$ ALD process described above, the $Al(CH_3)_3$ and oxidant reactants mix and react together in the relatively high temperatures produced by the vacuum pump to produce mostly solid $Al(OH)_3$ (aluminum hydroxide) and some $Al_2O_3$ (aluminum oxide) particles, both of which are very abrasive. Higher temperatures, such as the 300 to 400° C. range of the main ALD reaction chamber 14 tend to favor $Al_2O_3$ production, while slightly lower temperatures, e.g., 200 to 300° C. tend to result in more $Al(OH)_3$ production. Because the amounts of the reactants A and B in the ALD process effluent are so large, a lot of the abrasive byproducts are produced, which can and typically do severely damage and destroy vacuum pumps within a few hours or a few days of operation.

The hot reactor trap 10, therefore, is positioned in the foreline 12 between the ALD reaction chamber 14 and the vacuum pump 16, according to this invention, to capture the reactants A and B on adsorbent surfaces in a hot enough environment to favor reactions of A and B to produce the abrasive byproducts where they can be trapped and effectively removed from the effluent gas flow before they reach the vacuum pump 16. Details of an example hot reactor trap 10 for this purpose are shown in FIGS. 2-6.

Figure 2:
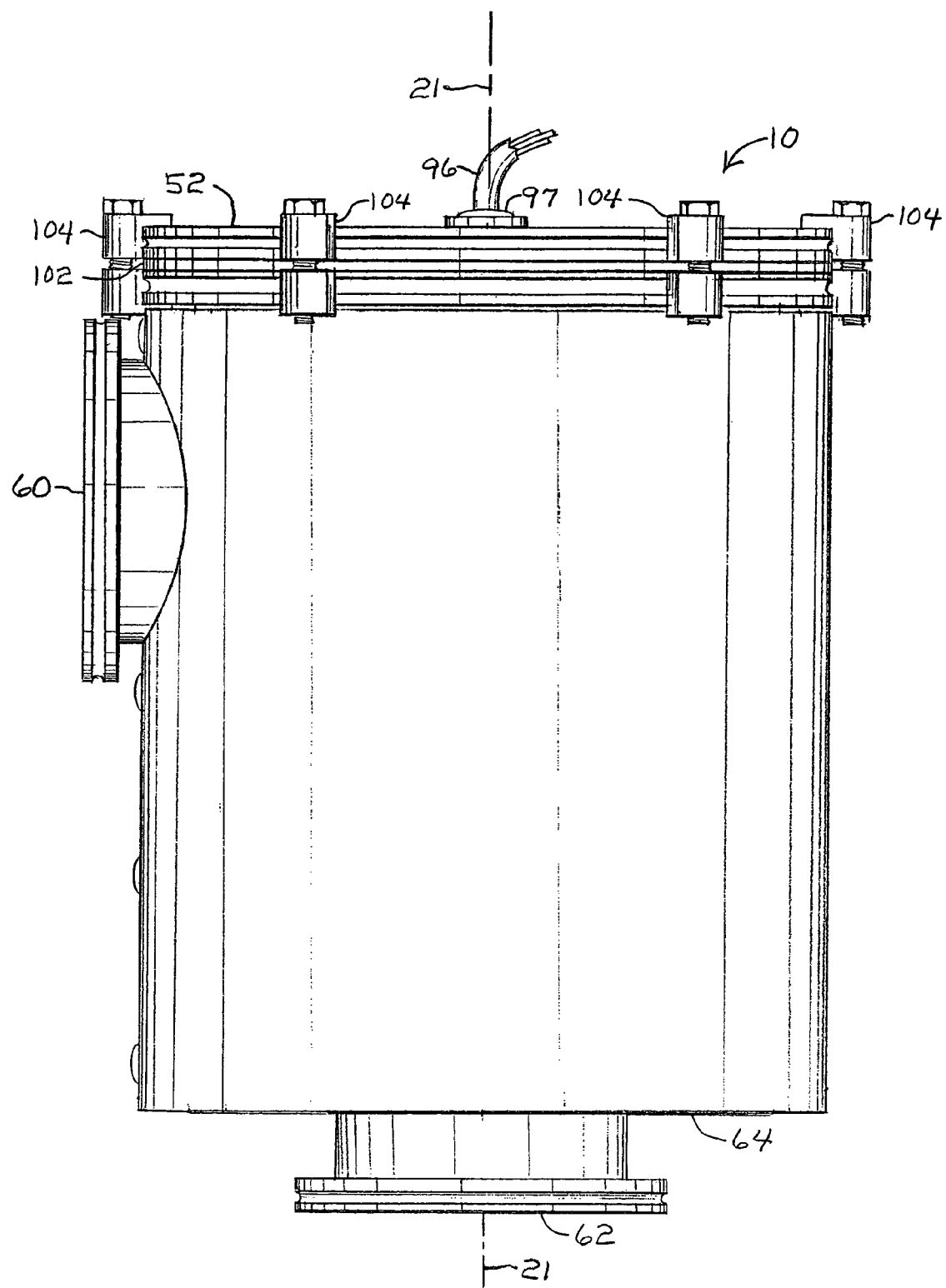
FIG. 2 is a side elevation view of the example hot reactor trap of this invention.
Figure 3:
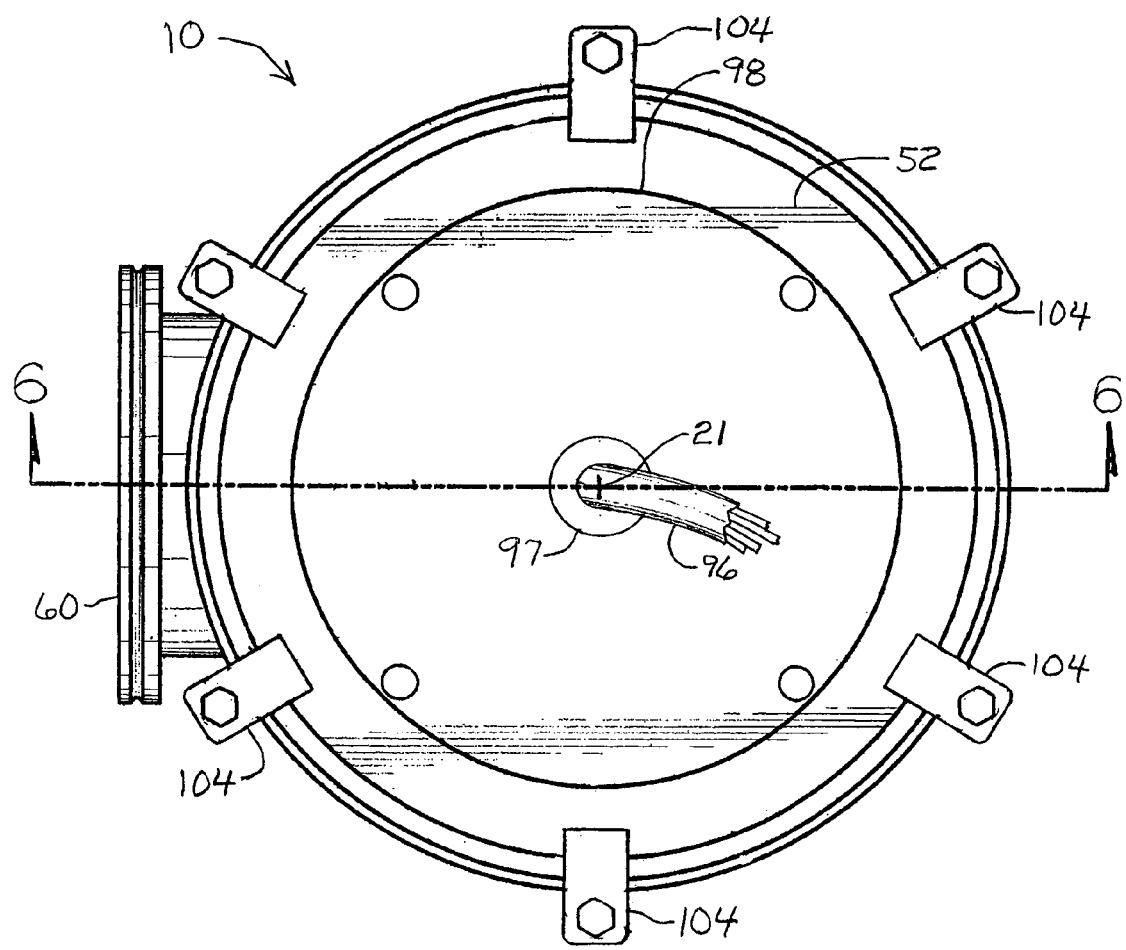
FIG. 3 is a top plan view of the example hot reactor trap of this invention.
Figure 4:
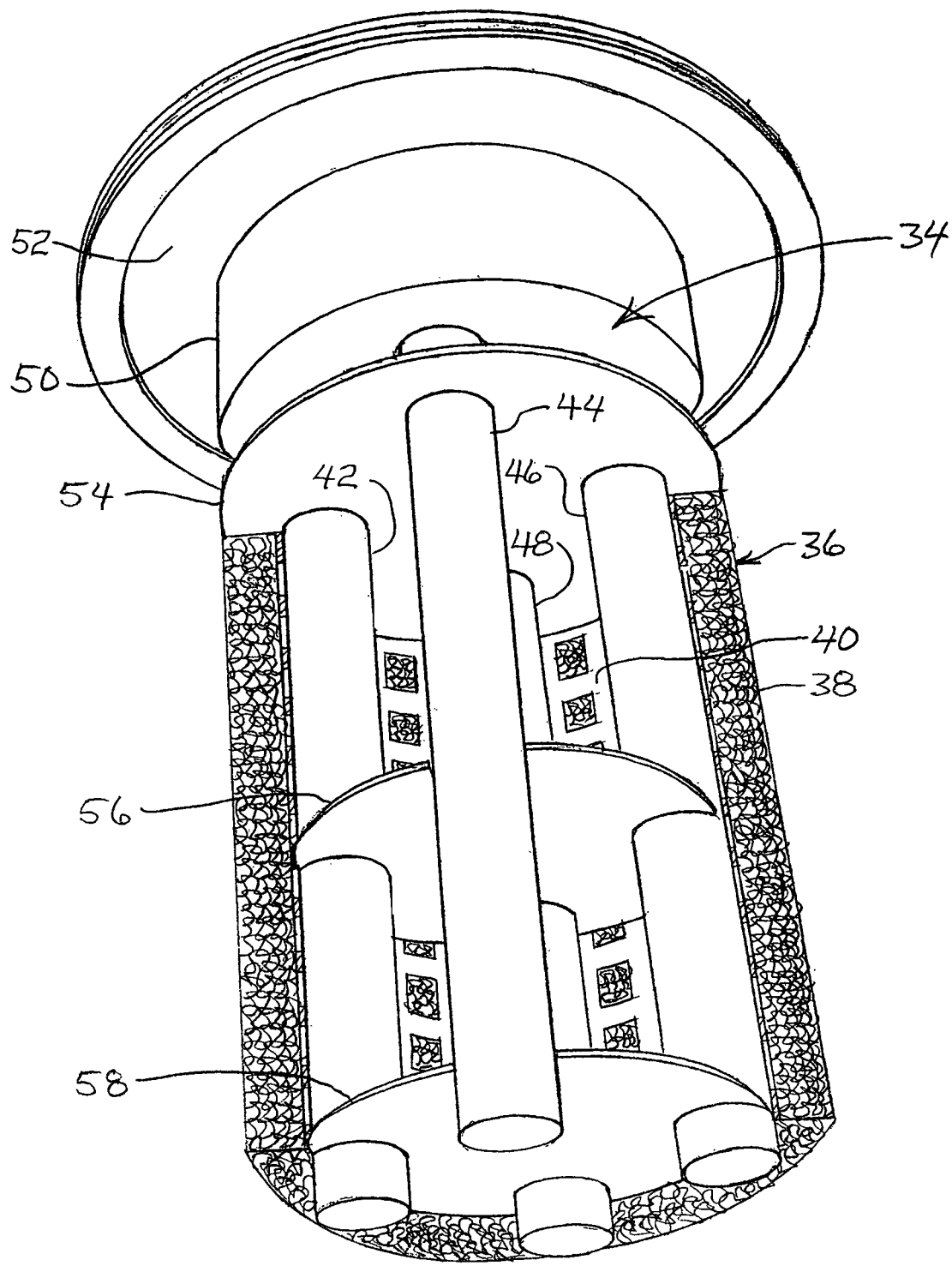
FIG. 4 is a perspective view of the heater core of the example hot reactor trap of this invention.
Figure 5:
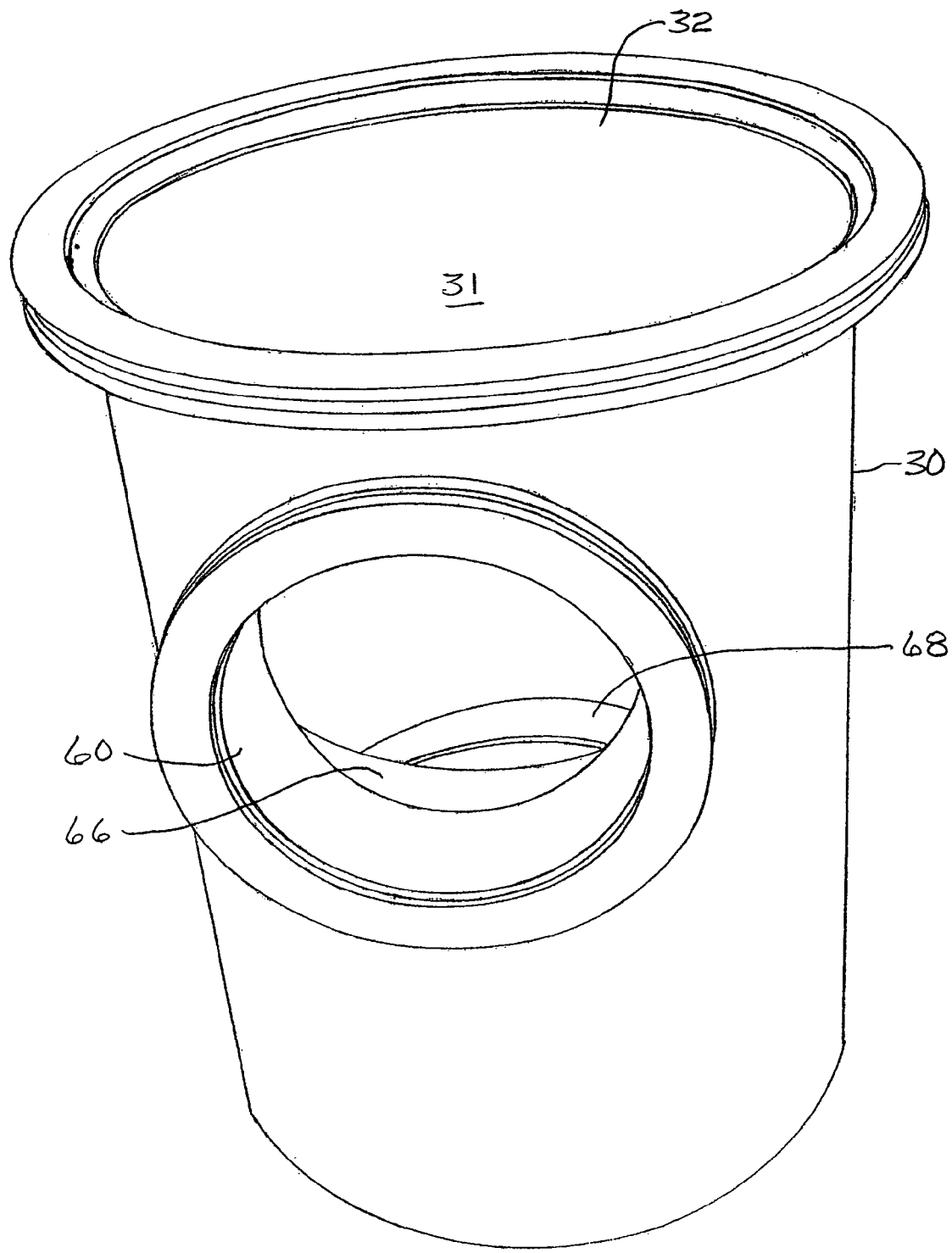
FIG. 5 is a perspective view of the housing of the example hot reactor trap of this invention.
Figure 6:
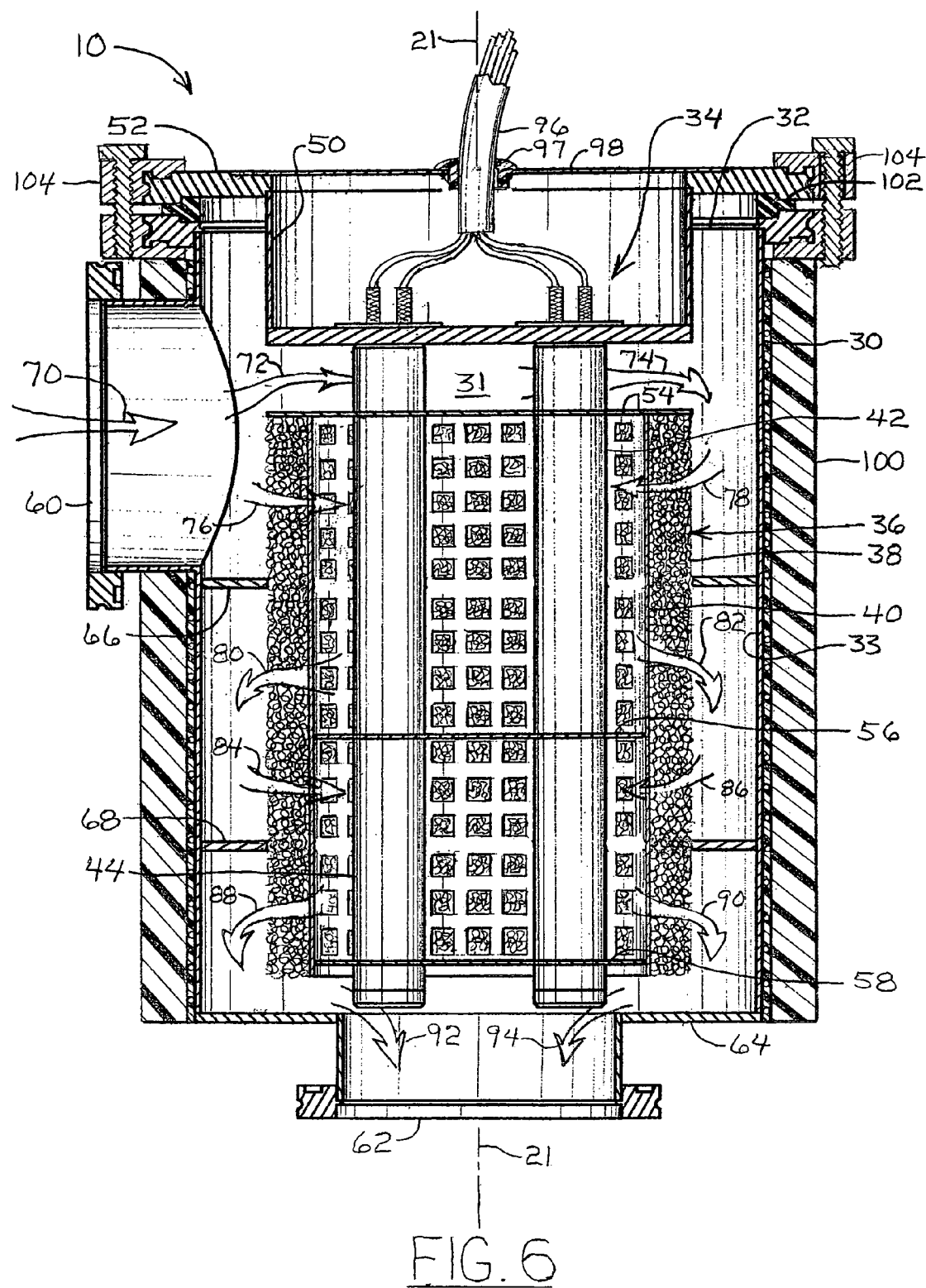
FIG. 6 is a cross-section view of the example hot reactor trap of this invention taken along section line 6-6 in FIG. 3.

Referring now initially to FIG. 5 supplemented by FIG. 4, but with continuing secondary reference to FIGS. 2, 3, and 6, the hot reactor trap 10 has a housing 30, preferably cylindrical, which encloses a secondary reaction chamber 31 (FIG. 5), and which has an openable top end 32 for receiving a heater assembly 34 (FIG. 4) and a removable and disposable high surface area reactor element 36 (FIG. 4), which preferably comprises a mesh 38 of adsorbent material, such as stainless steel, copper, or other material that can withstand the high temperature environment of the hot reactor trap 10. The reactor element 36, as best seen in FIGS. 4 and 6, is preferably a cylindrical shape with the mesh 38 supported by a porous cylindrical sheet 40 of material that can withstand the high temperatures in the hot reactor trap 10, such as 200 to 500° C. For example, the porous sheet 40 can also be stainless steel, copper, or other material that can withstand the high temperature environment of the hot reactor trap 10. In FIGS. 4 and 6, only about half of the cylindrical reactor element 36 is shown in order to reveal the heater elements 42, 44, 46, 48 of the heater assembly 34, but, with this illustration, persons skilled in the art can understand its full cylindrical embodiment, which is preferably easily removable from the heater assembly 34 and disposable, so it can be replaced with a new reactor element 36 as needed.

The heater assembly 34 comprises one or more heater elements, such as the heater elements 42, 44, 46, 48 mounted in a cup 50, which is attached to, and preferably an integral part of, a cover plate 52, so that the integral combination of the cover plate 52 and cup 50 encloses the top end 32 of the housing 30, when the heater assembly is inserted into the housing 30, to maintain the vacuum integrity of the secondary reaction chamber 31 in the trap 10. A plurality of interior baffle plates, such as the top, middle, and bottom baffle plates 54, 56, 58, attached in longitudinally spaced distances from each other to the heater elements 42, 44, 46, 48 provide the dual functions of stabilizing or providing structural support and rigidity to the elongated heater elements 42, 44, 46, 48 and directing the flow of ALD effluent in a tortuous path through the secondary reaction chamber 31, as will be described below. The top interior baffle plate 54 preferably extends radially outward far enough to abut and enclose the top end of the cylindrical reactor element 36, while the middle and bottom interior baffle plates 56, 58 extend radially into contact with the inside surface of the reactor element 36. When the heater assembly 34 is removed from the housing 30, the reactor element 36 can be removed easily by sliding it longitudinally off the heater assembly 34, so it can be replaced with a new reactor element 36.

An inlet 60 directed transverse to the longitudinal axis 21 of the trap 10 is provided in the side of the housing 30 and adapted for connection to the foreline 12, as shown in FIG. 1, and an outlet 62, which is parallel to the longitudinal axis 21, is provided in the bottom end 64 of the housing 30 and adapted for connection to an extension 12' of the foreline, which connects to the vacuum pump 16 (FIG. 1). As best seen in FIG. 6, the housing 30 also has several annular exterior baffle plates or rings 66, 68 extending radially inward from the interior surface 33 of the housing 30 to the reactor element 36 for also helping to guide the ALD effluent flow in the tortuous path through the secondary reaction chamber 31.

Referring now primarily to FIG. 6, with secondary reference to FIG. 4, the heater elements 42, 44, 46, 48 (two of which can be seen in FIG. 6), heat the secondary reaction chamber 31 and the mesh 38 to the desired temperature to react the reactants A and B on the many microsurfaces of the mesh 38, usually in a range of 200 to 500° C. The ALD effluent from the ALD reaction chamber 14 and foreline 16 (FIG. 1) containing the reactants A and B flow through the inlet 60 into the secondary reaction chamber 31 provided by the hot reactor trap 10, as indicated by flow arrow 70. In the secondary reaction chamber 31, the ALD effluent flow disperses around the reactor element 36, as indicated by flow arrows 72, 74, and then flows through the reactor element 36, as indicated by arrows 76, 78. The top exterior baffle plate or ring 66 prevents flow down through the annulus around the reactor element 36, and the top interior baffle plate 54 prevents the ALD effluent from flowing into the interior of the reactor element 36 without going through the mesh 30.

Inside the reactor element 36, flow is generally axially downward initially, but the middle interior baffle plate 56 directs the ALD effluent flow radially outward and then through the mesh 38 of the reactor element 36 to the mid-portion of the annulus of the secondary reaction chamber 31 between the exterior baffle rings 66, 68, as indicated by flow arrows 80, 82. The bottom exterior baffle ring 68 then directs the ALD effluent flow radially inward and through the mesh 38 again, as indicated by the flow arrows 84, 86, to then flow generally axially downward again, whereupon the bottom interior baffle plate directs the flow radially outward and through the mesh 38 again, as indicated by flow arrows 88, 90.

Of course, more baffles and more reactor element length could be used to provide more passes of the ALD effluent through the mesh 38 of the reactor element 36, or fewer baffles for fewer passes through the mesh 38 could be used. However, the four passes through the mesh 38 as shown in FIG. 6 and described above is sufficient for many applications. After the last pass through the mesh 38, the effluent flow continues, as indicated by flow arrows 92, 94 to the outlet 62, from where it flows through the foreline extension 12' to the vacuum pump 16 (FIG. 1).

The flow of the ALD reactants A and B with the ALD effluent through the hot mesh 38 of the reactor element 36, as described above, causes reactions of reactants A and B on the many hot microsurfaces of the mesh 38 to effectively deposit A and B reaction products on the microsurfaces of the mesh 38. However, unlike the relatively small surface area of the substrate 20 in the main ALD reaction chamber 14 (FIG. 1), which reacts and retains typically less than about 10 to 20 percent of the reactants A and B, as explained above, the relatively large cumulative surface area provided by the many microsurfaces of the mesh 38 in the reaction reactor element 36 reacts and retains virtually all of the residual reactants A and B so that they do not reach the vacuum pump 16. In an example ALD deposition of $Al_2O_3$ on the substrate 20, which occurs in a temperature range of 300 to 400° C. as described above, maintaining a temperature of about 200 to 300° C. in the secondary reaction chamber 31 will result in reaction of the $Al(CH_3)_3$ and oxidant reactants before they reach the vacuum pump to react there.

As mentioned above, the mesh 38 can be, for example, stainless steel, copper, or other material that can withstand the high temperatures in the secondary reaction chamber 31, with a microsurface density in a range of about 2 $in^2/in^3$ to 15 $in^2/in^3$, preferably about 8 $in^2/in^3$, where the $in^2/in^3$ is cumulative microsurface area expressed in square inches within a volume of mesh expressed in cubic inches, and the mesh 38 is preferably at least 0.25 inches thick. These microsurface densities and thickness parameters are preferred in order for the mesh to create turbulent flow of the reactants A and B in close proximity to the microsurfaces of the mesh to enhance both gas-phase reactions and surface reactions of the reactant gases A and B. Such elongated dwell time and turbulences of the reactants A and B are particularly important in ALD process effluents to ensure that all of the sequential reactant gas flows separated by inert gas pulses get thoroughly mixed, reacted, and removed from the effluent in the secondary reaction chamber 31 before the remaining effluent flows to the vacuum pump 16. The heater elements 42, 44, 46, 48 can be made in any manner known to persons skilled in the art, but the Firerod® cartridges available from Watlow Electric Manufacturing Company of St. Louis, Mo., are particularly well-suited for this application. These heater elements 42, 44, 46, 48 are preferably adjustable to provide different desired temperatures in the secondary reaction chamber 31 to accommodate optimizing the operating temperature to get the reactions needed. The electric wires 96 for powering such heater elements can be routed through a grommet 97 in a top closure plate 98 on the cover plate 52, as shown in FIGS. 2, 3, and 6. The cover plate 52 with the heater assembly 34 can be mounted on the housing 30 in any conventional manner that provides a vacuum seal, such as with the ring seal 102 and clamps 104, which are well-known to persons skilled in the art.

It is preferred that the housing 30 is surrounded by insulation or, if desired, an insulated heater jacket, such as the insulated heater jacket 100 shown in FIGS. 2 and 6, to help maintain the desired temperature in the hot reactor trap 10. Such heater jackets 100 are well-known in the art, for example, those described in U.S. Pat. No. 5,714,738 invented by D. Hauschulz and D. Hilton. Generally, the heater jacket 100 is not required and an insulation jacket is sufficient. However, for reactive chemicals that require higher temperatures to assist the chemical reaction in the secondary reaction chamber 31 as described above, use of such a heater jacket 100 can be helpful. The insulation jacket can also help to keep the outside surface temperature of the trap 10 at a lower temperature to help avoid skin burns to persons working on or close to the hot reactor trap 10.

Use of the hot reactor trap 10 of this invention for reacting and removing reactants in effluent from chemical vapor deposition (CVD) effluents is not limited to ALD processes, but also has applications in some other CVD processes as well. For example, in conventional single wafer, i.e., single substrate, CVD processes, a reactive in-situ cleaning step using an etching reaction is often integrated into the process steps to ensure the effective cleaning of the process chamber. Unfortunately, the potential cross-chemical reaction between residual gases in the CVD effluent and the in-situ cleaning step byproducts can sometimes form solid, abrasive byproducts inside the vacuum pump to cause premature failure of the vacuum pump. This adverse phenomenon is especially prevalent when a sticky gas, such as ammonia ($NH_3$) and water vapor ($H_2O$), are used. For example, ammonia and water often have relatively long resident times in a vacuum pump foreline because of their high adsorption rate on the surface of the foreline. A typical example CVD process in which this phenomenon occurs is plasma-enhanced chemical vapor deposition (PECVD) of silicon nitride ($Si_3N_4$), where silane ($SiH_4$) and ammonia ($NH_3$) are used for the deposition of silicon nitride and either nitrogen fluoride ($NiF_3$) or carbon hexafluoride ($C_2F_6$) is used for the in-situ cleaning, and solid $(NH_4)_2SiF_6$ is often found inside the prematurely worn vacuum pumps. The hot reactor trap 10 used according to this invention can solve that problem.

In general, a preferred design of the hot reactor trap is to: (i) Provide a high temperature (adjustable) secondary reaction chamber 31 that can initiate and sustain the chemical reaction between the unreacted precursor reactant gases A and B; (ii) Provide a long enough resident or dwell time for the reactant gases A and B in the secondary reaction chamber 31 to react substantially all of the reactants in the effluent, which is a function of flow path length as well as of available adsorption and reaction surface area; (iii) Increase the turbulence in the gas phase of the reactants A and B in close proximity to the hot reaction surfaces or microsurfaces as provided by the mesh 38 to enhance both gas-phase and surface reactions; (iv) Provide an inexpensive reaction carrier, i.e., the mesh, so that it can be disposable; and (v) Maintain a low outside surface temperature on the trap 10 for safe handling and minimizing chances of skin burn. The specific sizes of the secondary reaction chamber 31, reactor element 36, and number and placement of the interior and exterior baffles will depend on the amount and rate of flow of a particular CVD effluent from a particular CVD process, whether it is an ALD-CVD process, and the volatility and reactivity of the particular reactants used, and they can be determined empirically, by calculations, or both by persons skilled in the art to achieve the desired result of mixing and reacting substantially all of the reactants and thereby removing the reactants from the effluent, once they understand the principles of this invention. "Substantially all" as used herein means at least enough reduction in vacuum pump wear to justify the expense of installing, operating, and maintaining the hot reactor trap 10 in the CVD system, and, preferably, enough so that the vacuum pumps can be operated for durations that are considered to be reasonably consistent with normal vacuum pump uses with reasonably normal wear.

Since these and numerous other modifications and combinations of the above-described method and embodiments will readily occur to those skilled in the art, it is not desired to limit the invention to the exact construction and process shown and described above. Accordingly, resort may be made to all suitable modifications and equivalents that fall within the scope of the invention as defined by the claims which follow. The words "comprise," "comprises," "comprising," "have," "having," "include," "including," and "includes" when used in this specification and in the following claims are intended to specify the presence of stated features or steps, but they do not preclude the presence or addition of one or more other features, steps, or groups thereof.

The invention claimed is:

1. A method of protecting a vacuum pump in a chemical vapor deposition (CVD) system from CVD reactants in effluent from an ALD process in an evacuated primary CVD reaction chamber in the system where the reactants in the effluent are initially successive flows of individual reactants separated by pulses of purge gas flows, comprising:
heating a reaction element that comprises a mesh in an evacuated secondary reaction chamber positioned in a foreline between the primary CVD reaction chamber and the vacuum pump to a temperature that accommodates reaction of the CVD reactants; and
flowing all of the effluent of individual separated reactants into and through enough of the mesh of the heated reactor element to thoroughly mix all of the theretofore individual separated reactants together with each other in the mesh so that the mixed reactants react together in gas-phase and surface reactions in and on the mesh to react substantially all of the CVD reactants in and on the mesh and thereby to consume the reactants in and on the mesh, which effectively removes the reactants from the effluent before the effluent reaches the vacuum pump.

2. The method of claim 1, including heating the secondary reaction chamber and the reactor element to a temperature in a range of 200 to 500° C.

3. The method of claim 1, including flowing the reactant gases in the effluent through a tortuous path that increases dwell time of the reactant gases in the secondary reaction chamber.

4. The method of claim 1, wherein the ALD process includes reacting $Al(CH_3)_3$ and an oxidant in the primary CVD reaction chamber in an ALD temperature range of 300° C. to 400° C. that favors production of $Al_2O_3$ reaction product, and includes heating and maintaining the secondary reaction chamber and reactor element in a secondary reaction temperature range of 200° C. to 300° C. that favors production of a secondary $Al(OH)_3$ reaction product.

5. A method of protecting a vacuum pump in an $Al_2O_3$ chemical vapor deposition (CVD) system from $Al(CH_3)_3$ and oxidant reactants that flow in sequential pulses of the $Al(CH_3)_3$ followed by the oxidant reactants separated by a purge gas in effluent from the $Al_2O_3$ CVD deposition that has taken place in an evacuated primary CVD reaction chamber at a deposition temperature range of 300° C. to 400° C. that favors production of the $Al_2O_3$ CVD product, comprising:
heating a reactor element that comprises a mesh in an evacuated secondary reaction chamber positioned in a foreline between the primary CVD reaction chamber and the vacuum pump to a secondary reaction temperature range of 200° C. to 300° C. that favors production of a $Al(OH)_3$ secondary reaction product from reaction of the $Al(CH_3)_3$ and oxidant CVD reactants; and
flowing the effluent of separated reactants into the secondary reaction chamber and, in the reaction chamber, flowing all of the effluent through enough of the mesh in the heated reactor element to thoroughly mix the reactants together in order to react the CVD reactants in gas-phase and surface reactions in an on the mesh and thereby to consume the reactants in production of the secondary reaction product in and on the mesh, which effectively removes the reactants from the effluent before the effluent reaches the vacuum pump.

6. The method of claim 5, wherein the CVD reactants are in effluent from an ALD process where they are initially successive flows of the individual reactants separated by pulses of purge gas flows, and wherein the mesh causes sufficient turbulence in close proximity to enough microsurfaces in long enough flow paths of the effluent in the secondary reaction chamber to mix substantially all of the individual reactants together with each other and to react substantially all of the reactants together in the secondary reaction chamber and thereby remove them from the effluent flow before they reach the vacuum pump.

7. The method of claim 6, including flowing the reactant gases in the effluent through a tortuous path that repeatedly passes the reactant gases into and out of the mesh to increase dwell time of the reactant gases in the secondary reaction chamber.

8. A method of protecting a vacuum pump downstream from a primary reaction chamber in an ALD system from reactants of ALD processes that flows in effluent from the primary reaction chamber in pulses of the individual reactants separated by purge gas, comprising:

heating a reactor element that comprises a mesh in an evacuated secondary reaction chamber positioned in a foreline between the primary reaction chamber and the vacuum pump to a temperature that accommodates reaction of the reactants; and flowing all of separated individual reactants of the effluent into and through enough of the mesh of the heated reactor element to thoroughly mix all of the theretofore individual separate reactants together with each other in the mesh so that the mixed reactants react together in gas-phase and surface reactions in and on the mesh to react substantially all of the ALD reactants in and on the mesh and thereby to consume the reactants in and on the mesh, which effectively removes the reactants from the effluent before the effluent reaches the vacuum pump.

* * * * *